US012607657B2

(12) United States Patent
Bura et al.

(10) Patent No.: US 12,607,657 B2
(45) Date of Patent: Apr. 21, 2026

(54) METHOD AND APPARATUS FOR ASCERTAINING AN AVERAGE CHOKE CURRENT OR AN INPUT OR OUTPUT VOLTAGE IN A STEP-UP OR STEP-DOWN CONVERTER

(71) Applicant: Robert Bosch GmbH, Stuttgart (DE)

(72) Inventors: Dennis Bura, Renningen (DE);
Markus Michels, Stuttgart (DE);
Michael Jiptner, Renningen (DE)

(73) Assignee: Robert Bosch GmbH, Stuttgart (DE)

( * ) Notice: Subject to any disclaimer, the term of this patent is extended or adjusted under 35 U.S.C. 154(b) by 587 days.

(21) Appl. No.: 18/042,226

(22) PCT Filed: Aug. 4, 2021

(86) PCT No.: PCT/EP2021/071756
§ 371 (c)(1),
(2) Date: Feb. 20, 2023

(87) PCT Pub. No.: WO2022/037942
PCT Pub. Date: Feb. 24, 2022

(65) Prior Publication Data
US 2023/0296653 A1     Sep. 21, 2023

(30) Foreign Application Priority Data

Aug. 20, 2020    (DE) ..................... 10 2020 210 573.1

(51) Int. Cl.
*G01R 19/25*      (2006.01)
*G01R 19/175*     (2006.01)
*H02M 3/158*      (2006.01)
(52) U.S. Cl.
CPC ....... *G01R 19/2503* (2013.01); *G01R 19/175* (2013.01); *H02M 3/158* (2013.01)

(58) Field of Classification Search
CPC . G01R 19/2503; G01R 19/175; H02M 3/158; H02M 1/0009; H02M 1/0058; Y02B 70/10
See application file for complete search history.

(56) References Cited

U.S. PATENT DOCUMENTS 10,128,752 B1 *  11/2018  Kanzian ............. H02M 3/1584
10,340,914 B1 *   7/2019  Wu ........................ H02M 1/096
(Continued)

FOREIGN PATENT DOCUMENTS

CH        701847 A2 *  3/2011  ........ H02M 7/53871
CH        701856 A2    3/2011
(Continued)

OTHER PUBLICATIONS

Translation of International Search Report for Application No. PCT/EP2021/071756 dated Oct. 27, 2021 (2 pages).

*Primary Examiner* — Alexander Satanovsky
(74) *Attorney, Agent, or Firm* — Michael Best & Friedrich LLP

(57)        ABSTRACT

Method (100) for ascertaining a parameter (I_avg, I_N, I_P, V_c), wherein the parameter (I_avg, I_N, I_P, V_c) characterizes a current or a voltage in a circuit arrangement (200). The circuit arrangement (200) comprises an inductor (L) through which an alternating choke current (I_L) flows. The method comprises the steps of: ascertaining (120) at least one duration (TN1) between two zero crossings (N_-, N_+) of the choke current (I_L), or a duration (TNE1) between a zero crossing (N_-, N_+) and a vertex (E_-, E_+) of the choke current (I_L); ascertaining (130) the parameter (I_avg, I_N, I_P, V_c) as a function of the ascertained duration (TN1, TNE1).

9 Claims, 3 Drawing Sheets

(56) References Cited

U.S. PATENT DOCUMENTS

| | | | | |
|---|---|---|---|---|
| 10,361,554 | B1 | 7/2019 | Demski et al. | |
| 11,817,776 | B2 * | 11/2023 | He | H02M 1/4208 |
| 12,057,779 | B2 * | 8/2024 | Plum | H02M 3/33592 |
| 2013/0038066 | A1 * | 2/2013 | Diaz | F03D 9/32 |
| | | | | 290/55 |
| 2015/0077074 | A1 | 3/2015 | Rahimi et al. | |
| 2022/0070984 | A1 * | 3/2022 | Van Dijk | H05B 45/3725 |

FOREIGN PATENT DOCUMENTS

| | | | |
|---|---|---|---|
| DE | 102013102977 | A1 | 10/2013 |
| DE | 102015101673 | A1 | 8/2015 |
| JP | 2015165762 | A | 9/2015 |

* cited by examiner

METHOD AND APPARATUS FOR ASCERTAINING AN AVERAGE CHOKE CURRENT OR AN INPUT OR OUTPUT VOLTAGE IN A STEP-UP OR STEP-DOWN CONVERTER

BACKGROUND OF THE INVENTION

The invention relates to a method and to an apparatus for ascertaining a parameter, wherein the parameter character-izes a current or a voltage in a circuit arrangement. Further-more, the invention relates to a voltage estimator, to a drivetrain having a corresponding apparatus, and to a vehicle having a drivetrain, as well as to a computer program and a machine-readable storage medium.

Circuit arrangements for active voltage converters for use in vehicles are known from the prior art. High demands are placed on the power density and the efficiency of the voltage converters. In order to minimize the installation size of the passive components—in particular, the inductors, chokes, or transformers—the voltage converters are operated at high switching frequencies in the range of several hundred kHz. In order to also ensure high efficiency, the switching ele-ments or power semiconductors used in the active voltage converters are switched on softly, which is also called "zero voltage switching" (ZVS). The control of such systems while simultaneously ensuring the ZVS constitutes a great technical challenge. Such control is frequently realized by means of a detection of the zero crossing of the current, also called zero current detection (ZCD), as disclosed for example in the document CH 701856 A2. These controls offer many advantages with regard to their dynamics and stability.

Particularly with regard to the steadily increasing switch-ing frequencies in power electronics, and the associated short periods, however, critical disadvantages of the con-ventional ZCD method arise: The direct reaction to an ascertained or detected zero crossing of the current places very high demands on the control unit of the power elec-tronics system (e.g., a microcontroller or ASIC). This is due to the fact that the reaction to the zero crossing of the current has to occur immediately, i.e., still within the same switch-ing period. For example, in such methods, the remaining switch-on time (cf. FIG. 3, S2on+) of the activated switch after the zero crossing must be determined. In this case, multiple computation operations and register accesses must be carried out, which must not take longer than a small portion of the period of the switching frequency of the power electronics. This is complicated by the fact that no time remains for a plausibility check and error correction of the ZCD signal. In addition, many microcontrollers do not provide the possibility of direct, external intervention in the PWM module. Furthermore, the switching frequency is usually not controllable in the conventional ZCD method. The classical method also does not constitute closed-loop control as such; rather, it is open-loop control.

Therefore, there is a need for control methods for active voltage converters in which there is no need to react directly to a zero crossing of the current.

SUMMARY OF THE INVENTION

A method is proposed for ascertaining a parameter, wherein the parameter characterizes a current or a voltage in a circuit arrangement. The circuit arrangement comprises an inductor, wherein an alternating choke current flows through the inductor. The method comprises the steps of: ascertaining at least one duration between two zero crossings of the choke current or a duration between a zero crossing and a vertex of the choke current; ascertaining the parameter as a function of the ascertained duration.

A method is provided in which a parameter is ascertained, wherein the parameter characterizes a current or a voltage in a circuit arrangement. The circuit arrangement comprises an inductor. The inductor is preferably a choke or a primary or secondary winding of a transformer, which is preferably used in a DC/DC converter or in a charging device—preferably for the galvanic separation of the input and output. An alternating choke current flows through the inductor. "Alternating" means that the choke current alter-nately assumes negative and positive values. In order for the choke current to alternate, the inductor is alternately con-nected, at a first terminal of the inductor, to a first potential—preferably a positive potential—and to a second potential—preferably a negative potential. This results in a choke current through the inductor, which alternately rises linearly up to a positive maximum and then drops linearly down to a negative minimum, and so on. The time point at which the choke current reaches the positive maximum is referred to in the following as the positive vertex. The time point at which the choke current reaches the negative minimum is referred to in the following as the negative vertex. The change from linearly rising to linearly dropping, or vice versa, occurs during the change of the one-sided connection of the induc-tor from the first potential to the second potential, or vice versa. During the drop of the choke current from the positive maximum to the negative minimum, the sign of the choke current changes from positive to negative in what is known as a zero crossing, and preferably first zero crossing, of the choke current. During the rising of the choke current from the negative minimum to the positive maximum, the sign of the choke current changes from negative to positive in a—preferably second—zero crossing of the choke current. Preferably, the first terminal of the inductor is connected to the first potential and the second potential by means of a half bridge having two switching elements, wherein a first switching element is connected on one side to the first potential and is connected on the other side to a center tap of the half bridge, and a second switching element is connected on one side to the second potential and is con-nected on the other side to the center tap of the half bridge, wherein the inductor is connected on one side by the first terminal to the center tap. For this purpose, in each case preferably one switching element is activated alternately, while the other is deactivated. Thus, the time point of the actuation of at least one of the switching elements also corresponds, in each case, to one of the time points at which the choke current reaches either the positive maximum or the negative minimum. The inductor is preferably connected to a third potential by a second terminal. In order for the first and the second potentials to be different, an input voltage is preferably applied between two potentials of the first, sec-ond, or third potential. The input voltage is preferably an AC voltage or a DC voltage. Preferably, the frequency of the input voltage is very much lower than, and preferably at least one order of magnitude less than, the frequency of the alternating choke current. Preferably, an approximately con-stant voltage then results during a period of the alternating choke current. By means of a step of the method, at least one duration between two zero crossings of the choke current, and preferably between a first and a subsequent second zero crossing of the choke current, is ascertained. Thus, the duration between a first zero crossing of the choke current is preferably ascertained, in which the sign changes from positive to negative, and an immediately following second zero crossing of the choke current is ascertained, in which the sign changes from negative to positive, or vice versa. Alternatively, a duration between a zero crossing and a vertex of the choke current, and preferably between a second zero crossing and a positive vertex of the choke current, is ascertained. In the wording of ascertaining the duration between two zero crossings or a zero crossing and a vertex, a zero crossing is understood as a time point at which the sign of the alternating choke current changes from positive to negative or vice versa. In a further step of the method, the parameter is ascertained as a function of the ascertained duration.

Advantageously, a method is provided which makes it possible to determine a parameter as a function of a time variable which is ascertained in connection with the zero crossings of a choke current, wherein the parameter characterizes a current or a voltage in a circuit arrangement. No current or voltage sensor is required for this purpose. Instead, the duration between two zero crossings or the duration between the vertex and the zero crossing is, advantageously, used in order to preferably ascertain information such as an average value or peak values of the choke current or of a voltage within the circuit arrangement. The parameter to be ascertained is preferably the current mean value of the choke current, wherein the current average value preferably corresponds to the value of the input current of the circuit arrangement or correlates therewith. Both ZCD methods make use of the fact that the average value of the (ribbed) choke current in L is equal to the input current I_avg.

A state estimation is then preferably established based upon these newly obtained parameters or measured values. Advantageously, in this method, one or more entire periods can elapse before the state estimator reacts. Therefore, a plausibility check and error detection of a ZCD signal can preferably be carried out, which increases the quality. Advantageously, a more favorable microcontroller can be used, since more time is available for the required computation operations. On the basis of the information obtained, further controllers, and preferably a voltage controller, can be used for several variables. Preferably, control of the current reversal points or the switching frequency can also be established, independently of the average value of the choke current. The choke current to be controlled can preferably be detected in a highly dynamic manner (each switching period) by means of this method. Advantageously, the current sensor which would otherwise be necessary can be omitted, or a more favorable sensor having a smaller bandwidth can be used. Advantageously, potential savings for further sensors result from additional state estimates based upon the zero crossing times. Advantageously, the parameter for controlling a voltage converter is preferably used as a feedback variable of a control loop—preferably of a voltage controller.

In another embodiment of the invention, the method relates to ascertaining a parameter, wherein the parameter characterizes a current between a first potential and a second potential in the circuit arrangement. The circuit arrangement comprises a half bridge having a first switching element and a second switching element. The first switching element is connected on one side to a first potential and is connected on the other side to a center tap of the half bridge. The second switching element is connected on one side to a second potential and on the other side to the center tap of the half bridge. The inductor is connected to the center tap by a first terminal, and is connected to a third potential by a second terminal. An input voltage is applied between the first potential and the third potential. The method comprises the steps of: alternating actuation, or activation and deactivation, of the first and second switching elements at a specifiable duty factor, such that the alternating choke current through the inductor results; ascertaining a first duration between a first zero crossing of the current and the actuation of at least one of the switching elements and ascertaining a second duration between the actuation of the at least one switching element and a second zero crossing of the current, ascertaining the parameter as a function of the input voltage, the first duration, and the second duration.

Advantageously, a method is provided for a circuit arrangement which makes it possible to ascertain a parameter as a function of a time variable which is determined in connection with the zero crossings of the choke current, wherein the parameter characterizes a current applied in the circuit arrangement.

In another embodiment, a first capacitor is connected to the first and the second potential, and the parameter to be ascertained is a voltage average value of the voltage which is applied at the first capacitor.

A method is provided in which the circuit arrangement further comprises a first capacitor which is connected between the first and the second potential. Advantageously, a voltage average value of the voltage which is applied to the first capacitor is ascertained as the parameter.

In another embodiment of the invention, ascertaining the first duration and the second duration comprises ascertaining a first time point of a first zero crossing of the choke current and ascertaining a second time point of an actuation operation of at least one of the switching elements and ascertaining a third time point of a second zero crossing of the choke current. Preferably, ascertaining the first duration and the second duration comprises ascertaining the first time point at which the sign of the choke current changes from negative to positive, the subsequent ascertaining of a second time point at which at least one of the switching elements is actuated, and the subsequent ascertaining of a third time point at which the sign of the choke current changes from positive to negative or vice versa in each case.

Preferably, the time points of the zero crossings are ascertained by means of a sensor which detects the zero crossing—preferably by means of a current sensor or by means of an inductively obtained signal.

Advantageously, a method for ascertaining the first, second, and third time points is provided.

In another embodiment of the invention, the first duration between the first and the second time points, and/or the second duration between the second and third time points, is ascertained by means of a counter—preferably a microcontroller.

The use of a counter—preferably a microcontroller—is a way of ascertaining a duration which can be carried out using simple technical means. Each microcontroller has a counter which counts up at equidistant time intervals. The elapsed duration can consequently be determined from the difference between the counter states from the second to the first time point and/or the third to the second time point.

Advantageously, a method is provided for ascertaining the duration between the time points.

Furthermore, the invention relates to a computer program comprising commands which, when the program is executed by a computer, cause the computer to carry out the described methods or the steps of the method.

Furthermore, the invention relates to a computer-readable storage medium comprising commands which, when executed by a computer, cause the computer to carry out the described methods or the steps of the method.

The invention further relates to a voltage estimator for ascertaining and outputting an estimated voltage between a first potential and a second potential, wherein the voltage estimator comprises a logic unit and an estimator, wherein the logic unit is configured to carry out a method for ascertaining a parameter, wherein the estimator is configured to predict, as a function of input variables, a model-based voltage between the first potential and the second potential, and to ascertain and output the estimated voltage as a function of the predicted model-based voltage and the ascertained parameter.

A voltage estimator is provided for ascertaining and outputting an estimated voltage. The voltage estimator comprises a logic unit for ascertaining a parameter according to the described method. Furthermore, the voltage estimator comprises an estimator, and preferably a state estimator, e.g., by means of a Kalman filter or a Luenberger observer, which is based upon a—preferably dynamic—mathematical model of the circuit arrangement used. With the aid of the mathematical model, a model state is predicted as a function of the input variables, and preferably the physical route, e.g., as a function of known variables such as input voltage, duty factor, and/or the time point of the switching interventions— for example, a voltage in the circuit arrangement between a first potential and a second potential. This predicted model state is the predicted model-based voltage. The estimator is further designed to adjust or correct this predicted model-based voltage as a function of the parameter determined by means of the described methods—for example, by means of a weighting. The result of this adjustment is the estimated voltage ascertained by the voltage estimator, which is preferably output by the voltage estimator.

Advantageously, a current controller is provided which takes into account, as a correction variable, a parameter ascertained by means of a duration between zero crossings. An estimated voltage of increased quality is, advantageously, provided. Preferably, an extended method for ascertaining the estimated voltage is provided, having a state estimator, which contains a dynamic model which describes the behavior of the voltage to be estimated and also performs a correction of the voltage calculated by the model, as well as a logic unit which is configured to carry out a described method, wherein the ascertained parameter is taken into account for the correction step of the state estimator.

Furthermore, the invention relates to a voltage regulator for controlling a voltage between a first potential and a second potential, having a logic unit and a controller, wherein the logic unit is configured to carry out a described method, wherein the ascertained parameter is taken into account as a feedback variable of the control by the controller, and the current specification is output as a control variable into the potentials, whose difference defines the voltage to be controlled. In this case, said current specification into the potentials can be implemented by a further controller—preferably by means of a subordinate current control.

A voltage controller is provided for controlling a voltage in the circuit arrangement. The controller incorporates, as a feedback variable, a parameter ascertained by means of the described methods. Preferably, the current specification is output as a control variable into the potential, whose difference defines the voltage to be controlled. However, another variable can also be output as a control variable, which indirectly has access to the current in the potentials whose difference defines the voltage to be controlled.

Advantageously, a current controller is provided which takes into account, as a feedback variable, a parameter ascertained by means of a duration between zero crossings. Advantageously, a current sensor can be dispensed with in this control.

Furthermore, the invention relates to an apparatus—in particular, a DC/DC converter or a charging device—having an inductor, wherein the inductor is arranged in a circuit arrangement, wherein the apparatus is designed to carry out a described method. The parameter ascertained in this case is further used as a measured variable within the apparatus, e.g., in the plausibility check of an ascertained or calculated, estimated, observed, or measured variable. Alternatively, the ascertained parameter is transmitted via an interface—preferably by means of a cable—in a contactless manner, by radio or by an optical waveguide, to outside the apparatus.

An apparatus is provided into which the circuit arrangement is integrated and in which the method is carried out for ascertaining the parameter. The ascertained parameter is either further used within the apparatus for the operation of the apparatus, or is transmitted to the outside for a further use outside—preferably in a further apparatus or a control unit.

Furthermore, the invention relates to a drivetrain having a described apparatus, and in particular having power electronics and/or an electric drive. Such a drivetrain serves, for example, to drive an electric vehicle. The method and the apparatus enable reliable operation of the drivetrain.

The invention further relates to a vehicle having a described drivetrain. Advantageously, a vehicle is thus provided which comprises a described apparatus.

Of course, the features, properties, and advantages of the method according to the invention apply to or can be used accordingly in the current controller, the apparatus or the drivetrain, and the vehicle, and vice versa.

Further features and advantages of embodiments of the invention will become apparent from the following description with reference to the accompanying drawings.

BRIEF DESCRIPTION OF THE DRAWINGS

The invention will be explained in more detail below with reference to some drawings, in which.

DETAILED DESCRIPTION

Figure 1:
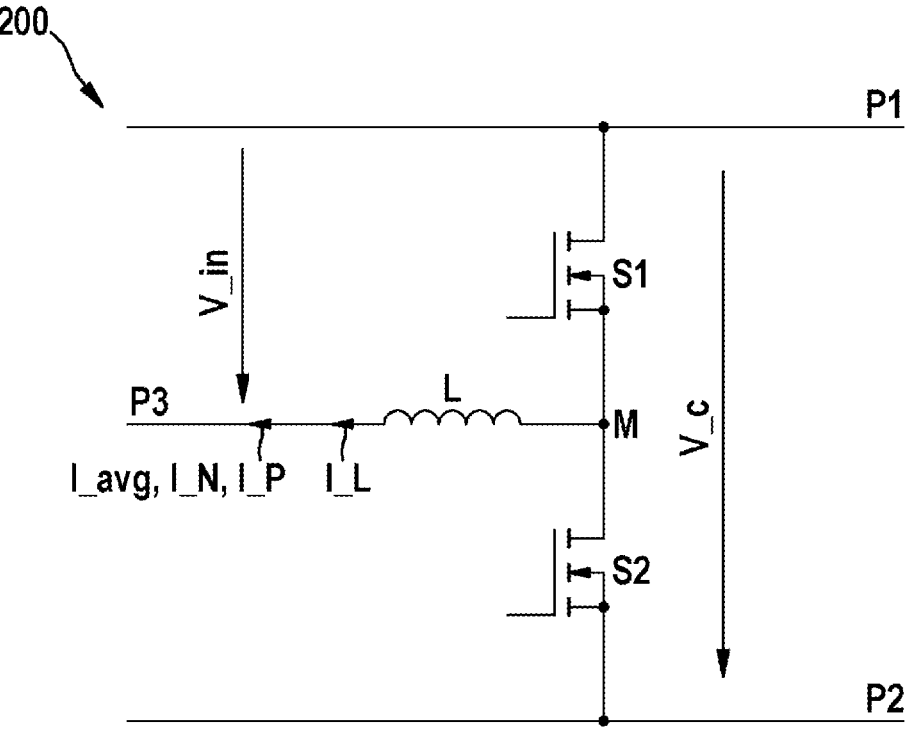
FIG. 1 is a schematic view of a circuit arrangement.

FIG. 1 shows a circuit arrangement 200, wherein the circuit arrangement 200 comprises an inductor L through which an alternating choke current I_L flows. The inductor is preferably a choke or a primary or secondary winding of a transformer, which is preferably used in a DC/DC converter or in a charging device—preferably for the galvanic separation of the input and output. The high-frequency alternating choke current I_L—preferably at a frequency of several hundred kHz—causes a current in the supply lines of the inductor L. Parameters by which this current is characterized are preferably a current average value I_avg, negative minima I_N and/or positive maxima I_P of the choke current I_L, or peak values of the choke current I_L. The choke current I_L through the inductor L also causes electrical voltages in the circuit arrangement. A parameter by which an electrical voltage is characterized—preferably when a load or impedance is connected to the inductor L—is preferably a voltage V_c which is applied between the first and the second potentials P1, P2. These parameters I_avg, I_N, I_P, V_c can be ascertained as a function of the duration TN1 between two zero crossings N_−, N_+ of the choke current I_L, or a duration TNE1 between a zero crossing N_−, N_+ and a vertex E_−, E_+ of the choke current I_L.

Furthermore, the circuit arrangement 200 preferably comprises a half bridge having a first switching element S1 and a second switching element S2. The first switching element S1 is connected on one side to a first potential P1, and on the other side to a center tap M of the half bridge. The second switching element S2 is connected on one side to a second potential P2 and is connected on the other side to the center tap M of the half bridge. The inductor L is connected by a first terminal to the center tap M and by a second terminal to a third potential P3. An input voltage V_in is preferably applied between the first potential P1 and the third potential P3. This input voltage V_in can alternatively also be applied between the third and the second potential, or also between the first potential P1 and the second potential P2. When an input voltage V_in is applied, the alternating choke current I_L through the inductor L can be generated via suitable actuation—preferably high-frequency actuation—of the switching elements S1 and S2. The input voltage V_in is preferably a DC voltage or an AC voltage, wherein the frequency of the input voltage is very much lower than the frequency of the choke current I_L, said frequency of the input voltage preferably being approximately 50 Hz, or at least below 1 kHz. An AC voltage is preferably rectified, by means of a diode rectifier, to a DC voltage as the input voltage.

Figure 2:
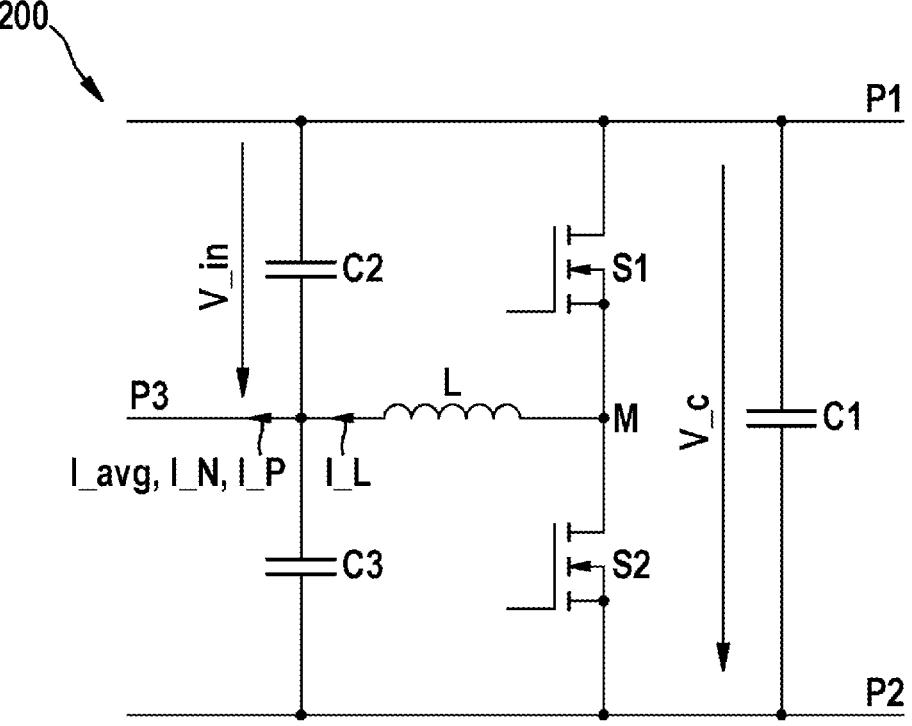
FIG. 2 is a schematic view of an expanded circuit arrangement.

FIG. 2 shows an expanded circuit arrangement 200 of the circuit arrangement 200 shown in FIG. 1. The circuit arrangement 200 according to FIG. 2 further comprises a first capacitor C1 which is arranged between the first potential P1 and the second potential P2, and is connected to each of these. The first capacitor C1 is preferably designed as an intermediate circuit capacitor, and preferably as an electrolytic capacitor. Preferably, a parameter which characterizes the voltage V_c at this first capacitor C1 can be ascertained as a function of a duration TNE1 and/or TNE2 between a zero crossing N_−, N_+ and a vertex E_−, E_+ of the choke current I_L (cf. also FIG. 3).

For example, the following applies:
During TNE1:

$$\frac{\Delta I\_L}{\Delta t} = \frac{V\_tn}{L}$$

$$\Delta I\_L = \frac{V_{in}}{L}(\Delta t) = \frac{V_{in}}{L}(\Delta TNE1)$$

(1)

During TNE2:

$$\frac{\Delta I\_L}{\Delta t} = \frac{V_c - V\_tn}{L}$$

$$V_c = V_{in} + \frac{\Delta I\_L(L)}{\Delta t} = V_{in} + \left(\frac{\Delta I\_L(L)}{TNE2}\right)$$

(2)

(1) in (2) gives:

$$V_c = V_{in} + \frac{V\_in(TNE1)}{TNE2}$$

Furthermore, the circuit arrangement preferably comprises a second and/or a third capacitor C2, C3. The second capacitor C2 is connected on one side to the first potential P1 and is connected on the other side to the third potential P3. The third capacitor C3 is connected on one side to the third potential P3 and is connected on the other side to the second potential P2. These capacitors C2, C3 serve to smooth the current profile of the currents and the voltage profile of the voltages in the circuit arrangement 200—preferably when the switching elements S1 and S2 are closed and opened alternately.

Figure 3:
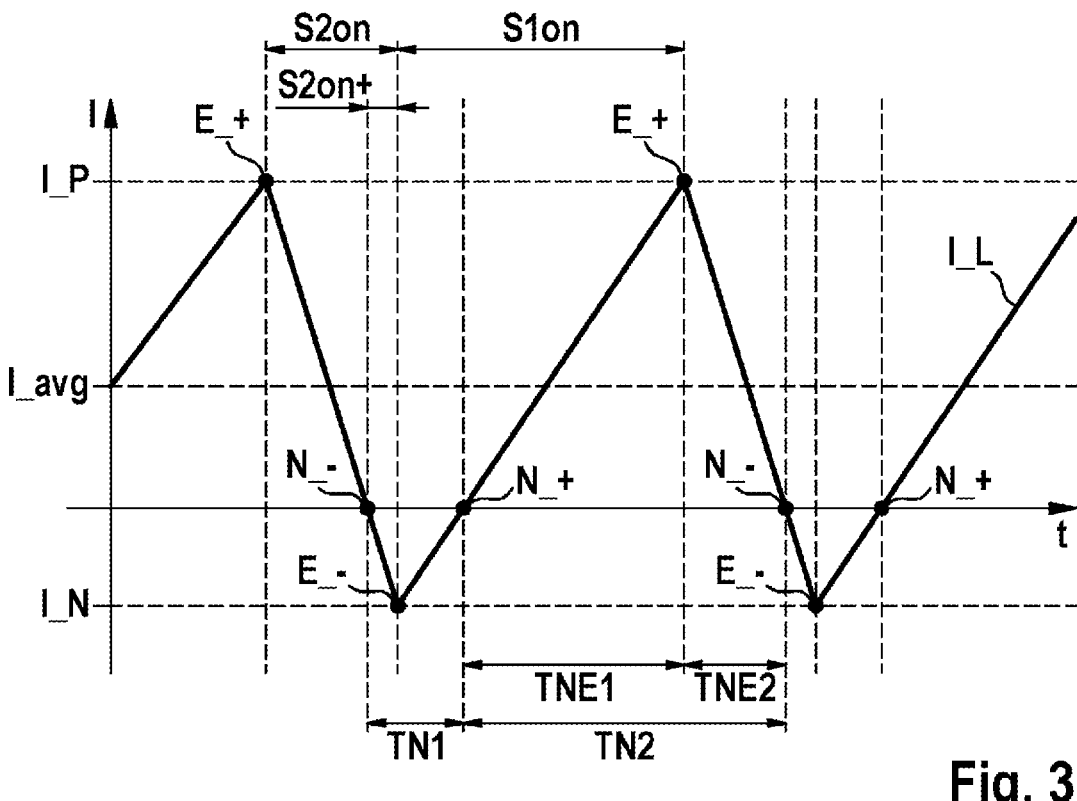
FIG. 3 is a schematic current/time diagram with an alternating choke current.

FIG. 3 is a schematic current/time diagram. In the diagram, the alternating choke current I_L through the choke or inductor L is plotted. The illustrated profile of the choke current I_L is produced when the switching elements S1 and S2 are closed and opened alternately. For example, a duration S2on is shown, during which the second switching element S2 is activated. Consequently, during this duration S2on, the first switching element S1 is open. Furthermore, a duration S1on is shown, during which the first switching element S1 is closed, and, consequently, the second switching element S2 is open. This sequence of the durations S2on and S1on repeats. The switching over of the switching elements takes place between the durations S2on and S1on, or S2on and S1on. The period T is the sum of the durations S2on and S1on. The ratio of the duration S1on to T is referred to as the duty factor a1. The vertices E_−, E_+ and negative and positive peak values, i.e., the negative minimum I_N and the positive maximum I_P, of the choke current I_L through the inductor L result at the switchover time points of the switching elements. As an average, a current average value I_avg results for the high-frequency choke current I_L, which average value is determined by means of graphical analysis of the regular high-frequency choke current I_L in the diagram as a function of a duration TN1 between two zero crossings N_−, N_+ of the choke current I_L, and preferably as a function of the input voltage V_in, the magnitude of the inductor L, a duty factor a1, and the duration TN1 between the zero crossings of the choke current I_L, and the period T. If the detection of V_c is simpler than the detection of V_in, the formulas described below can also preferably be set up as a function of V_c.

Using the intercept theorem from elementary geometry, the geometric profile of the choke current shows that:

$$\frac{TN1}{-I\_N} = \frac{\frac{T}{2}}{I_{avg} - I\_N}$$

And for the rising current, where di/dt=Vin/L during the duration S1on, the following applies:

$$I\_P - I\_N = \frac{V\_in}{L} S1on$$

Consequently $$I\_avg = \frac{V_{in}}{2L} a_1 (T - 2 \times TN1)$$

Furthermore, the negative or positive peak value I_N, I_P of the choke current I_L through the inductor L can also be ascertained:

From the overall current ripple $$I\_P - I\_N = \frac{V\_in}{L} a_1(T) \text{ And}$$

$$I\_P = I_{avg} + \frac{I\_P - I\_N}{2} \text{ And}$$

$$I\_N = I_{avg} + \frac{I\_P - I\_N}{2}$$

Can be determined by inserting I_N and I_P:

$$I_N = -\frac{V\_in}{L} a_1(TN1)$$

$$I\_P = \frac{V\_in}{L} a_1(T - TN1)$$

The formulas apply only to this circuit in the stationary, steady state, but similar formulas can also be derived for other topologies. The great advantage of the method is once again clear here: The calculation of the currents and the control intervention in the circuit based thereon can preferably take place after the duration TN1, and can preferably also extend over the following periods. In the classical ZCD method, it was necessary, in this cases, to react directly to the signal of the zero crossing N_−. This preferably reduces the hardware requirements, and offers sufficient time for a plausibility check of the measurement.

Thus, a highly dynamic "sensor" for the average value of the switched current is preferably realized by the method. The desired choke current can be set using a classical control structure. The ascertained current average value I_avg of the choke current I_L is already available after only one switching period, which makes it possible to make the controller acting thereon very high-performance. This makes it possible to stabilize the rapidly switched current dynamics. Similarly, for other topologies, conclusions can be drawn about other states on the basis of the measured durations between the zero crossings or between the zero crossing and vertex, which leads to a reduction in the required sensors, and results in a direct cost savings.

Figure 4:
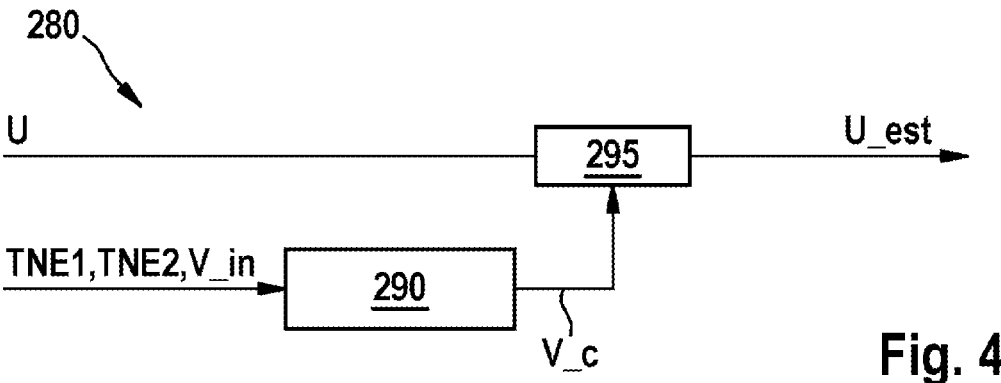
FIG. 4 is a schematic view of a voltage controller or state observer.

FIG. 4 is a schematic view of a voltage estimator 280 for ascertaining and outputting an estimated voltage U_est between a first potential P1 and a second potential P2. In a logic unit 290, the parameter is ascertained as a function of the ascertained durations, TNE1 and TNE2, and an input voltage V_in. The parameter ascertained according to the described method as a function of the durations TNE1 and TNE2, which parameter is preferably a voltage average value V_c, is taken into account as a correction variable of the estimation by the estimator 295 of the voltage estimator 280. For this purpose, input variables U—preferably system inputs and/or the detectable system states—are supplied to the estimator 295, by means of which variables the model stored in the estimator 295 predicts a model-based voltage. Subsequently, the model-based voltage is corrected using the voltage average value V_c calculated from the logic unit 290, whereupon the estimated voltage U_est is available. This estimated voltage can then be supplied to a voltage control which manipulates a controlled variable on the basis of the difference between the voltage target value and U_est, which control variable has access to the current in the potentials, whose difference defines the voltage to be controlled.

Figure 5:
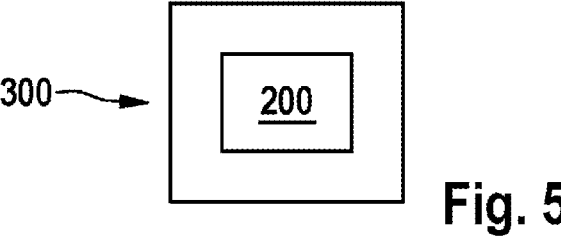
FIG. 5 is a schematic view of an apparatus having an inductor, wherein the inductor is located in a circuit arrangement.

FIG. 5 is a schematic view of an apparatus 300 having an inductor L, wherein the inductor is located in a circuit arrangement 200. The apparatus 300 is designed in particular as a DC/DC converter and/or as a charging device. The apparatus 300 is designed to ascertain a parameter, according to the described method, as a function of a duration TN1 between two zero crossings N_−, N_+ of the choke current I_L or a first duration TNE1 and a second duration TNE2—preferably a parameter as a current average value I_avg, a negative peak value I_N, or a positive peak value I_P. The ascertained parameter I_avg, I_N, I_P, V_c is further used as a measured variable within the apparatus 300, or transmitted to outside the apparatus 300 via an interface.

Figure 6:
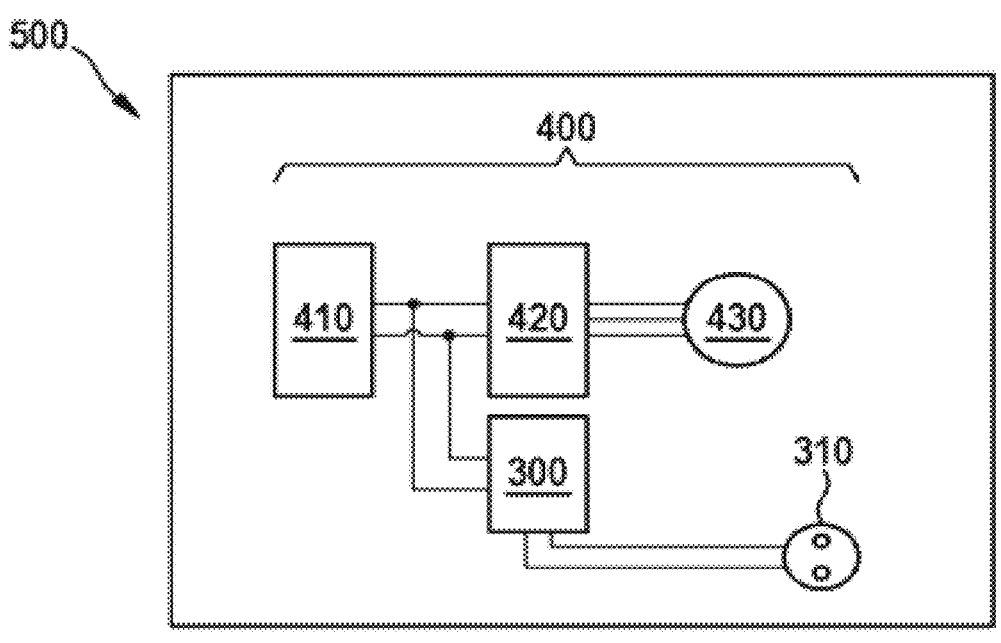
FIG. 6 is a schematic view of a vehicle having a drivetrain.

FIG. 6 is a schematic view of a vehicle 500—preferably a motor vehicle, ship, or aircraft, having a drivetrain 400. In addition to the apparatus 300, the drivetrain preferably comprises a battery 410, an inverter 420, an electrical machine 430, and/or a charging socket 310. The battery 410 preferably supplies the inverter 420 with electrical energy. The inverter 420 preferably converts the electrical energy of the battery 410 into a polyphase AC voltage for supplying power to the electrical machine 430. The apparatus 300 is preferably designed as a DC/DC converter or charging device. Preferably, the DC/DC converter converts the electrical energy of the battery 410 into a low voltage—preferably for supplying power to an on-board power supply of a vehicle 500, and/or vice versa. The charging device preferably converts electrical energy, supplied via the charging socket 310, into high-voltage energy—preferably for charging the electrical battery 410, or vice versa.

Figure 7:
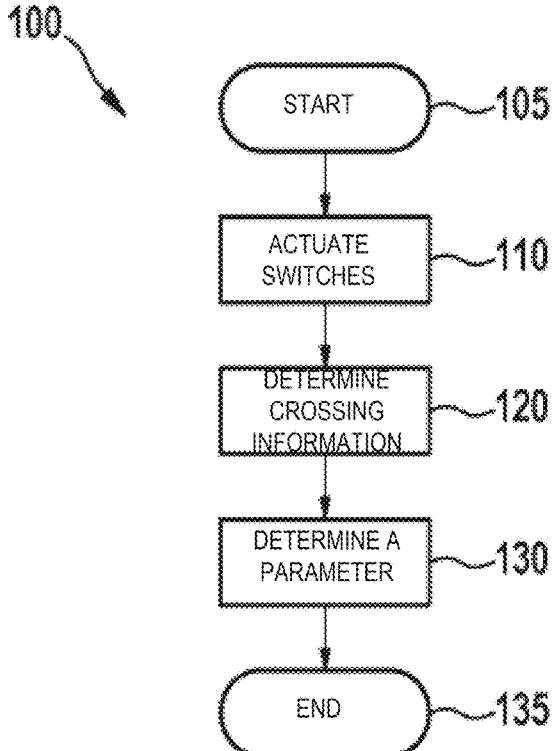
FIG. 7 is a schematic flowchart for a method for ascertaining a parameter, wherein the parameter characterizes a current or a voltage in a circuit arrangement.

FIG. 7 is a schematic flowchart for a method 100 for ascertaining a parameter I_avg, I_N, I_P, V_c, wherein the parameter I_avg, I_N, I_P, V_c characterizes a current or a voltage in a circuit arrangement 200. The method begins with step 105. In step 110, the first and the second switching elements S1, S2 are preferably actuated alternately, resulting in an alternating choke current I_L through the inductor L. In step 120, at least one duration TN1 between two zero crossings N_−, N_+ of the choke current I_L is ascertained, or a duration TNE1 between a zero crossing N_−, N_+ and a vertex E_−, E_+ of the choke current I_L is ascertained. In step 130, a parameter I_avg, I_N, I_P, V_c is ascertained as a function of the ascertained duration TN1, TNE1. The method ends with step 135.

The invention claimed is:

1. A method for operating a circuit arrangement and determining a parameter (V_c), wherein the parameter (V_c) characterizes a voltage in the circuit arrangement, wherein the circuit arrangement comprises a half bridge having a first switching element (S1) and a second switching element (S2) and an inductor (L) connected to the half bridge, wherein an alternating choke current (I_L) flows through the inductor (L), said method comprising the steps of:

determining a duration (TNE1) between a zero crossing (N_−, N_+) and a vertex (E_−, E_+) of the choke current (I_L);

determining the parameter (V_c) as a function of the ascertained duration (TNE1); and controlling, based on the parameter (V_c), operation of the circuit arrangement by alternately actuating the first and the second switching element (S1, S2) at a specifiable duty factor (a1) resulting in the alternating choke current (I_L) through the inductor (L).

2. The method according to claim 1, wherein the parameter (V_c) characterizes a voltage between a first potential (P1) and a second potential (P2) in the circuit arrangement, wherein the first switching element (S1) is connected on one side to the first potential (P1) and is connected on the other side to a center tap (M) of the half bridge, wherein the second switching element (S2) is connected on one side to the second potential (P2) and is connected on the other side to the center tap (M) of the half bridge, wherein the inductor (L) is connected by a first terminal to the center tap (M) and is connected by a second terminal to a third potential (P3), wherein an input voltage (V_in) is applied between the first potential (P1) and the third potential (P3), said method further comprising the steps of:

determining a first duration (TNE1) between a first zero crossing (N_+) of the current and the actuation of at least one of the switching elements (S1, S2), and determining a second duration (TNE2) between the actuation of the at least one switching element (S1, S2) and a second zero crossing (N_−) of the current;

determining the parameter (V_c) as a function of the input voltage (V_in), the first duration (TNE1), and the second duration (TNE2), wherein determining the first duration (TNE1) and the second duration (TNE2) comprises determining a first time point of a first zero crossing (N_−) of the choke current (I_L) when a sign of the choke current (I_L) changes from negative to positive, and subsequently determining a second time point of an actuation operation of at least one of the switching elements (S1, S2) and subsequently determining a third time point of a second zero crossing (N_+) of the choke current (I_L) when the sign of the choke current (I_L) changes from negative to positive or vice versa, and wherein the determination of the zero crossing times is carried out by means of a sensor.

3. The method according to claim 2, wherein a first capacitor (C1) is connected to the first and the second potential, and the parameter (V_c) is a voltage average value of the voltage that is applied at the first capacitor (C1).

4. The method according to claim 2, wherein the first duration (TNE1) between the first and the second time point and/or the second duration (TNE2) between the second and the third time point is ascertained by means of a counter.

5. A non-transitory, computer-readable storage medium comprising commands which, when executed by a computer, cause the computer to determine a parameter (V_c), wherein the parameter (V_c) characterizes a voltage in a circuit arrangement, wherein the circuit arrangement comprises a half bridge having a first switching element (S1) and a second switching element (S2) and an inductor (L) connected to the half bridge, wherein an alternating choke current (I_L) flows through the inductor (L), determine a duration (TNE1) between a zero crossing (N_−, N_+) and a vertex (E_−, E_+) of the choke current (I_L);

determine the parameter (V_c) as a function of the ascertained duration (TNE1); and controlling, based on the parameter (V_c), operation of the circuit arrangement by alternately actuating the first and the second switching element (S1, S2) at a specifiable duty factor (a1) resulting in the alternating choke current (I_L) through the inductor (L).

6. A voltage estimator for determining and outputting an estimated voltage (U_est) between a first potential (P1) and a second potential (P2), the voltage estimator comprising:

a logic unit (290), and an estimator, wherein the logic unit is configured to determine a parameter (V_c), wherein the parameter (V_c) characterizes a voltage in a circuit arrangement, wherein the circuit arrangement comprises a half bridge having a first switching element (S1) and a second switching element (S2) and an inductor (L) connected to the half bridge, wherein an alternating choke current (I_L) flows through the inductor (L), determine a duration (TNE1) between a zero crossing (N_−, N_+) and a vertex (E_−, E_+) of the choke current (I_L) (define zero crossing, vertex, switching time in description); and determine the parameter (V_c) as a function of the ascertained duration (TNE1), wherein the estimator is configured to predict a model-based voltage between the first potential (P1) and the second potential (P2) as a function of input variables (U), determine and output the estimated voltage (U_est) as a function of the model-based voltage and the parameter (V_c), and control, based on the parameter (V_c), operation of the circuit arrangement by alternately actuating the first and the second switching element (S1, S2) at a specifiable duty factor (a1) resulting in the alternating choke current (I_L) through the inductor (L).

7. An apparatus having an inductor (L), wherein the inductor (L) is arranged in a circuit arrangement, wherein the apparatus is configured to determine a parameter (V_c), wherein the parameter (V_c) characterizes a voltage in a circuit arrangement, wherein the circuit arrangement comprises a half bridge having a first switching element (S1) and a second switching element (S2) and an inductor (L) connected to the half bridge, wherein an alternating choke current (I_L) flows through the inductor (L), determine a duration (TNE1) between a zero crossing (N_−, N_+) and a vertex (E_−, E_+) of the choke current (I_L) (define zero crossing, vertex, switching time in description);

determine the parameter (V_c) as a function of the ascertained duration (TNE1), wherein the ascertained parameter (V_c) is further used as a measured variable within the apparatus or is transmitted to outside the apparatus via an interface;

control, based on the parameter (V_c), operation of the circuit arrangement by alternately actuating the first and the second switching element (S1, S2) at a specifiable duty factor (a1) resulting in the alternating choke current (I_L) through the inductor (L).

8. A drivetrain having an apparatus according to claim 7.

9. A vehicle having a drivetrain according to claim 8.

* * * * *